United States Patent
Singleton et al.

(10) Patent No.: US 6,795,279 B2
(45) Date of Patent: Sep. 21, 2004

(54) SPIN VALVE STRUCTURES WITH SPECULAR REFLECTION LAYERS

(75) Inventors: Eric W. Singleton, Greenfield, MN (US); Kristin Joy Duxstad, Eden Prairie, MN (US); Michael B. Hintz, Mahtomedi, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 10/754,317

(22) Filed: Jan. 9, 2004

(65) Prior Publication Data

US 2004/0141258 A1 Jul. 22, 2004

Related U.S. Application Data

(62) Division of application No. 09/835,131, filed on Apr. 12, 2001, now Pat. No. 6,700,753
(60) Provisional application No. 60/196,649, filed on Apr. 12, 2000.

(51) Int. Cl.[7] .............................................. G11B 5/39
(52) U.S. Cl. ............................. 360/324.11; 360/324.1; 360/324.12
(58) Field of Search ......................... 360/324.1, 324.11, 360/324.12; 428/689, 692, 693; 338/32 R; 324/207.21, 252

(56) References Cited

U.S. PATENT DOCUMENTS

| | | | |
|---|---|---|---|
| 5,898,612 A | 4/1999 | Chen et al. | 365/158 |
| 6,022,633 A | 2/2000 | Hayashi et al. | 428/692 |
| 6,031,692 A | 2/2000 | Kawawake et al. | 360/113 |
| 6,034,849 A | 3/2000 | Takizawa | 360/128 |
| 6,303,218 B1 * | 10/2001 | Kamiguchi et al. | 428/332 |
| 6,348,274 B1 | 2/2002 | Kamiguchi et al. | 428/692 |
| 6,407,890 B1 | 6/2002 | Gill | 360/314 |
| 6,556,390 B1 | 4/2003 | Mao et al. | 360/324.1 |
| 6,613,380 B1 * | 9/2003 | Gill | 427/131 |
| 6,700,753 B2 * | 3/2004 | Singleton et al. | 360/324.1 |
| 2001/0046110 A1 | 11/2001 | Kawawake et al. | 360/324.12 |
| 2002/0048690 A1 | 4/2002 | Kukuzawa et al. | 428/692 |
| 2002/0145836 A1 | 10/2002 | Gill et al. | 360/324.12 |
| 2003/0192168 A1 * | 10/2003 | Li et al. | 29/603.14 |

FOREIGN PATENT DOCUMENTS

EP         1124273 A2 *    8/2001      ........... H01L/43/10

OTHER PUBLICATIONS

H.J.M. Swagten et al., "Specular Reflection in Spin Valves Bounded by NiO Layers," Jul. 1998, IEEE Transactions on Magnetics, vol. 34, No. 4, pp. 948–953.

* cited by examiner

Primary Examiner—William J. Klimowicz

(57) ABSTRACT

This invention presents a method and structure for magnetic spin valves. The spin valve structure includes a first ferromagnetic layer separated from a second ferromagnetic layer by a non-magnetic layer. The spin valve structure also includes a first specular scattering layer separated from a second specular scattering layer by the first ferromagnetic layer, the non-magnetic layer, and the second ferromagnetic layer. The first ferromagnetic layer can include a free layer and the non-magnetic layer can include a spacer layer. The second ferromagnetic layer can include a pinned layer or a reference layer. The specular scattering layers can include a material such as $Y_2O_3$, $HfO_2$, MgO, $Al_2O_3$, NiO, $Fe_2O_3$, and $Fe_3O_4$. The specular scattering layers can also be used in a SAF structure. In the SAF structure, the antiferromagnetic coupling material can be co-deposited with the second specular scattering layer.

19 Claims, 5 Drawing Sheets

SPIN VALVE STRUCTURES WITH SPECULAR REFLECTION LAYERS

CROSS REFERENCE TO RELATED APPLICATION

This application is a divisional of and claims priority from U.S. application Ser. No. 09/835,131, filed Apr. 12, 2001, Now U.S. Pat. No. 6,700,753, which claims priority from U.S. provisional application serial No. 60/196,649 entitled "Spin Valve Structures with Secular Reflection Layers," which was filed on Apr. 12, 2000, wherein both said applications are hereby incorporated by reference in their entirety.

BACKGROUND

Magnetic sensors having a large magnetoresistive ratio and thermal stability, frequently referred to as "spin valve" sensors, are used for a number of sensor applications. Examples of these applications include recording heads, magnetic random access memory, switches, and various sensors that rely on a change in resistance to produce a signal.

A spin valve sensor is typically a sandwiched structure consisting of two ferromagnetic layers separated by a thin non-magnetic spacer layer. One of the ferromagnetic layers is called the "pinned layer" because it is magnetically pinned or oriented in a fixed direction by an adjacent antiferromagnetic layer, commonly referred to as the "pinning layer," through exchange coupling. The other ferromagnetic layer is called the "free" or "unpinned" layer because the magnetization is allowed to rotate in response to the presence of external magnetic fields. In a spin valve sensor, a change in resistance of a layered magnetic sensor is used to read data from a magnetic medium. This change is attributed to spin dependent transport of conduction electrons between the free magnetic layer and one or more pinned magnetic layers through the non-magnetic spacer layers.

Spin valve sensors benefit from the change of resistance exhibited by the devices, which can depend on the relative alignment between the magnetization of the two ferromagnetic layers. In many practical spin valve GMR heads, the layers have scattering at the boundaries that can limit the size of the GMR. This occurs when the thickness of the layers is comparable with or smaller than the mean free path of the conduction electrons. The scattering of conduction electrons depends on an interaction between the spin polarization and the magnetic orientation of the free and pinned layers. The more interfaces the electron goes through without being scattered, the larger the GMR value. In the existing spin valve applications, most of the electrons are scattered after entering the metallic capping layers or antiferromagnetic layer and no longer contribute to the GMR effect.

Synthetic antiferromagnetic ("SAF") spin valve structures have also been produced. SAF spin valve structures can provide higher magnetic and thermal stability than simple spin valve structures. A SAF spin valve includes a pinned layer structure that is composed of two ferromagnetic layers, separated by a nonmagnetic spacer layer. The first magnetic layer is called the pinned layer. The non magnetic layer is called the antiferromagnetic ("AFM") coupling layer. The second magnetic layer is called the reference layer. Similar to the layers of a simple spin valve, a SAF spin valve replaces the pinned layer of the simple spin valve with the layers of the SAF structure.

Specular reflection has been obtained using insulators as capping layers and antiferromagnetic pinning layers. This enhancement to the GMR has been demonstrated in Co/Cu based spin valves with NiO as the antiferromagnetic pinning layers. These spin valves, however, may have disadvantages when used for GMR head applications due to their poor thermal stability. The improvement of magnetoresistive ratios can also improve device sensitivity and enable new applications. This invention discusses some of these concerns.

SUMMARY

Accordingly, the present invention relates to a spin valve structure encompassing specular reflection layers to improve the magnetoresistive ratio and sensitivity of the spin valve.

In one aspect of this invention, a spin valve structure is presented. The spin valve structure includes a first ferromagnetic layer separated from a second ferromagnetic layer by a non-magnetic layer. The spin valve structure also includes a first specular scattering layer separated from a second specular scattering layer by the first ferromagnetic layer, the non-magnetic layer, and the second ferromagnetic layer. The first ferromagnetic layer can include a free layer and the non-magnetic layer can include a spacer layer. The second ferromagnetic layer can include a pinned layer or a reference layer. The specular scattering layers can include a material such as $Y_2O_3$, $HfO_2$, $MgO$, $Al_2O_3$, $NiO$, $Fe_2O_3$, and $Fe_3O_4$.

The spin valve structure can include an antiferromagnetic layer separated from the second ferromagnetic layer by the second specular scattering layer. Additionally, the spin valve structure can include a seed layer separated from the second specular scattering layer by the antiferromagnetic layer. The seed layer can also be separated from the first ferromagnetic layer by the first specular scattering layer.

In another aspect of the invention, the spin valve structure, the second specular scattering layer can be separated from the antiferromagnetic layer by a second pinned layer. The second specular scattering layer can be separated from the antiferromagnetic layer by an antiferromagnetic coupling layer, the antiferromagnetic coupling layer can be separated from the antiferromagnetic layer by a pinned layer, and the second ferromagnetic layer can include a reference layer. Additionally, the second specular scattering layer is separated from the antiferromagnetic coupling layer by a second reference layer. The antiferromagnetic coupling material can include a material such as Ru, Rh, and Cr.

The spin valve structure can also include a pinned layer separated from the second ferromagnetic layer by the second specular scattering layer. The second specular scattering layer can include a mixture of a specular scattering material and an antiferromagnetic coupling material. The specular scattering material comprises can include a material such as $Y_2O_3$, $HfO_2$, $MgO$, $Al_2O_3$, $NiO$, $Fe_2O_3$, and $Fe_3O_4$, and the antiferromagnetic coupling material can include a material such as Ru, Rh, and Cr. In the spin valve structure, the first and second ferromagnetic layer can include Co and Fe.

In another aspect of this invention, a method for forming a spin valve structure is presented. The method includes depositing a first ferromagnetic layer separated from a deposited second ferromagnetic layer by a deposited non-magnetic layer. A first specular scattering layer separated from a deposited second specular scattering layer by the first ferromagnetic layer, the non-magnetic layer, and the second ferromagnetic layer is also deposited.

The method can also include depositing a pinned layer separated from the second ferromagnetic layer by the second specular scattering layer, when the second ferromagnetic layer includes a deposited reference layer, and the deposition of the second specular scattering layer includes co-depositing a mixture of a specular scattering material and an antiferromagnetic coupling material.

The details of the methodology can be found in the Detailed Description section below. The advantages of this invention may include the following. The use of the two specular scattering layers can increase the GMR sensitivity of the spin valve structure. The specular scattering layers can also be placed within a SAF structure, which can enhance the GMR and maintain the strong coupling.

DETAILED DESCRIPTION

The present invention relates to a spin valve structure encompassing specular reflection layers to improve the magnetoresistive ratio and sensitivity of the spin valve structure.

Specular reflection layers can be used in a number of magnetoresistive structures, such as spin valves with synthetic antiferromagnet layers, simple spin valves with a pinned layer, spin valves with a cap layer, and spin valves with a seed layer. The specular reflection layer can provide an electron "mirror" to minimize spin dependent scattering in a spin valve structure, which can lead to an enhanced giant magnetoresistive ("OMR") effect in the spin valve structures. In addition, specular layers can serve to confine conduction electrons to the free layer/spacer layer/pinned layer of the spin valve structures.

The change in resistance observed in spin valve structures can arise from spin dependent scattering at interfaces and in the bulk of ferromagnetic layers. Some of the highest magnetoresistive ratios (those found in GMR) can be found in symmetric Co based NiO pinned Co/Cu/Co structures, while all metal spin valves have typically performed more poorly in terms of the GMR effect The specular reflection of electrons at interfaces may be an important contributor to a large GMR effect. Conversely, diffusely scattered electrons at interfaces may negatively affect the GMR effect by increasing the spin valve resistance. Such diffuse scattering may not contribute positively to the spin dependent transport of electrons in a spin valve structure.

Therefore, for high GMR spin valves, a material that exhibits a high degree of specular reflection of electrons should be used. When this material or combination of materials are inserted in appropriate positions in a spin valve structure, the GMR effect can be enhanced through a reduction in the diffuse scattering of electrons. Although many materials are known to reflect electrons in a specular nature, it can be advantageous to use materials that are also poor electrical conductors or are electrically insulating. An insulating specular layer can reduce the current shunting in the spin valve structure and can contain the appropriately polarized conduction electrons within the spin valve structure.

The materials for the specular scattering layers are chosen based on finding a suitable oxide to form a specular layer while maintaining acceptable magnetic properties for the spin valve structure. Experimentally, these materials should cause a high degree of specular electron reflection. Other features include a material with proper structural properties, high resistivity, thermal stability, high affinity for oxygen, and that can be sputter deposited in ultra thin layers with good repeatability and control. The specular scattering layers that can meet these features include $Y_2O_3$, $HfO_2$, $MgO$, $Al_2O_3$, $NiO$, $Fe_2O_3$, and $Fe_3O_4$.

Figure 1A:
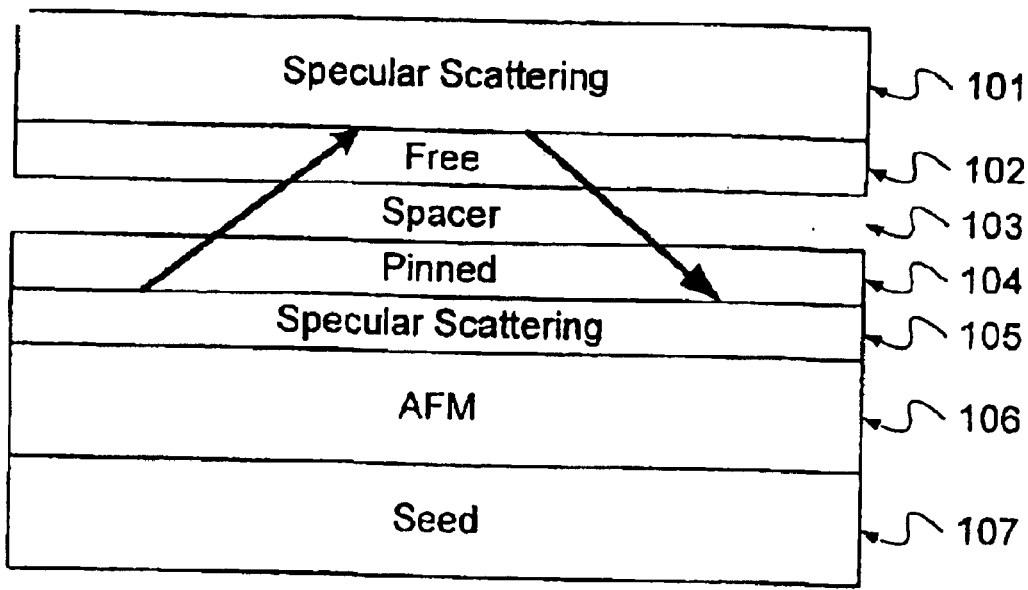
FIGS. 1A and 1B illustrate bottom spin valve structures with specular scattering layers.

Specular scattering layers can be used in several types of spin valve structures. FIG. 1A presents a simple bottom spin valve structure that uses a thin oxide specular layer next to the pinned layer and at the top of the free layer. The spin valve structure includes a seed layer 107, an antiferromagnetic layer 106, a first specular scattering layer 105, a pinned layer 104, a spacer layer 103, a free layer 102, and a second specular scattering layer 101. As is illustrated by the arrows, electrons can be reflected between the two specular scattering layers 101 and 105.

The pinned layer 104 and the free layer 102 can include an alloy of Co and Fe. The spacer layer 103 can include an alloy of Cu. The specular reflecting materials can include $Y_2O_3$, $HfO_2$, $MgO$, $Al_2O_3$, $NiO$, $Fe_2O_3$ or $Fe_3O_4$. The antiferromagnetic layer 106 can include materials such as PtMn, NiMn, IrMn, or PtCrMn.

As an example, a pinned layer 104 and a free layer 102 of a $Co_{1-x}Fe_x$ alloy, where x is typically from 5 to 15 atomic percent, can be chosen. This material can have a high spin polarization of electrons, relatively low magnetization, and relatively soft magnetic properties when formed appropriately.

When $Y_2O_3$ is inserted in the specular layer for varied CoFe free layer thickness from 20 to 35 Angstrom, increases to the GMR can be achieved as shown in Chart 1.

CHART 1

Increase to the GMR with $Y_3O_1$ Specular Layer

| CoFe fre layer thickness (Angstrom) | GMR Increas (%) |
|---|---|
| 20 | 15 |
| 25 | 17 |
| 30 | 12 |
| 35 | 8 |

Figure 1B:
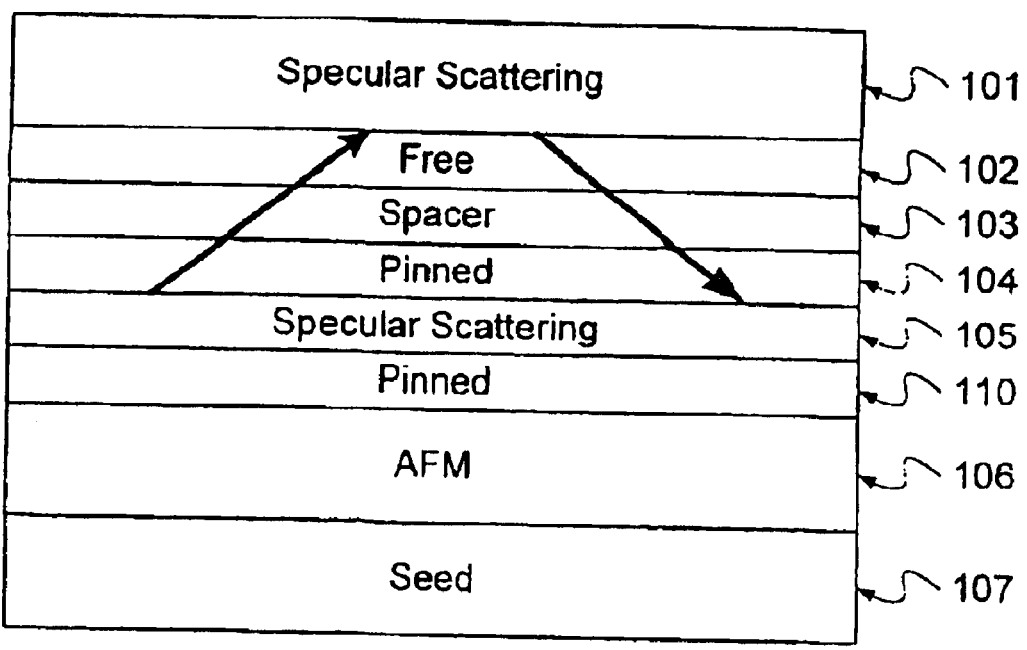

FIG. 1B presents a similar bottom spin, valve, which includes a second pinned layer 110 between the first specular scattering layer 105 and the antiferromagnet layer 106. The two pinned layers 110 and, 104 can include an alloy of Co and Fe,.

When a bottom spin valve, such as the one shown in FIG. 1B, is formed of a seed layer, an antiferromagnet layer, a CoFe pinned layer, a NiO specular scattering layer, a CoFe pinned layer, a Cu spacer layer, a CoFe free layer, and a $Y_2O_3$ specular scattering layer, it can show improvements of the magnetoresistive ratio of up to 60% over spin valve stacks without the oxide layers. Chart 2 illustrates the improvements to the GMR when a NiO specular scattering layer is inserted within the pinned layer of the bottom spin valve.

CHART 2

Increase to the GMR with NiO Specular Layer

| Pinned Layer NiO Specular Layer thickness (Angstrom) | GMR Increase (%) |
| --- | --- |
| 0 | 0 |
| 3 | 59 |
| 6 | 26 |

Figure 2A:
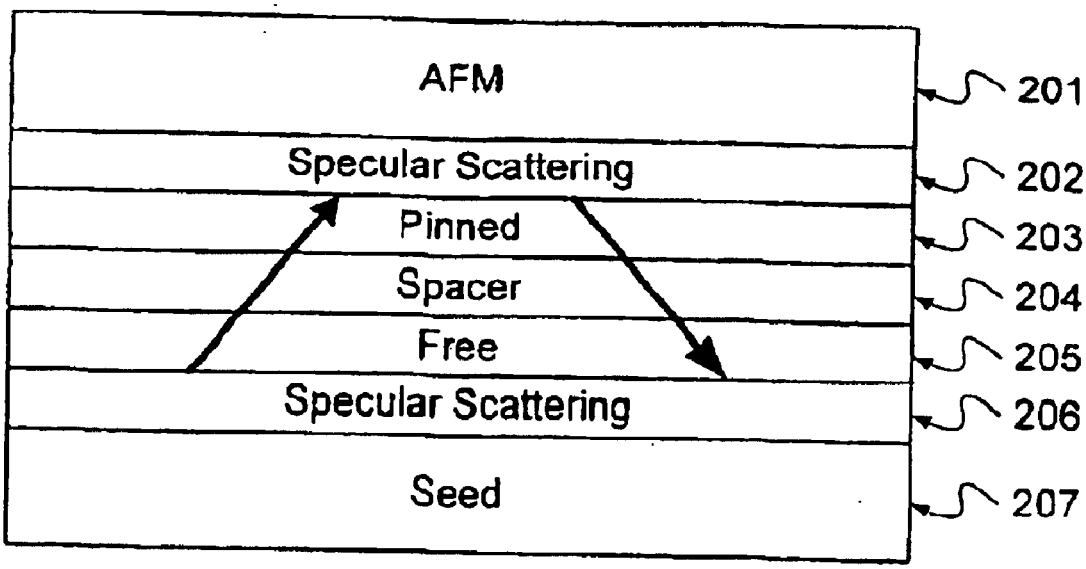
FIG. 2 illustrates a top spin valve structure with specular scattering layers.
Figure 2B:
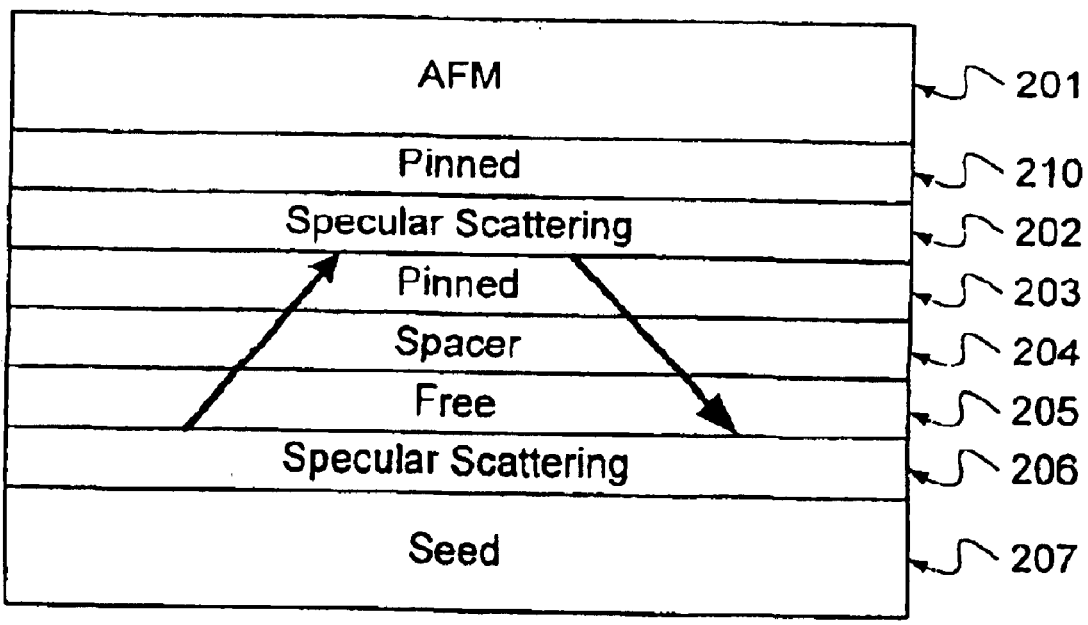

The specular scattering layer can also be used in a top spin valve as shown in FIGS. 2A and 2B. These structures are similar to the bottom spin valve described in FIGS. 1A and 1B. FIG. 2A shows a top spin valve structure formed of a seed layer 207, a first specular scattering layer 206, a free layer 205, a spacer layer 204, a pinned layer 203, a second specular scattering layer 202 and an antiferromagnet layer 201. Similarly, FIG. 2B shows a top spin valve with a second pinned layer 210 inserted between the antiferromagnetic layer 201 and the second specular scattering layer 202.

Figure 3A:
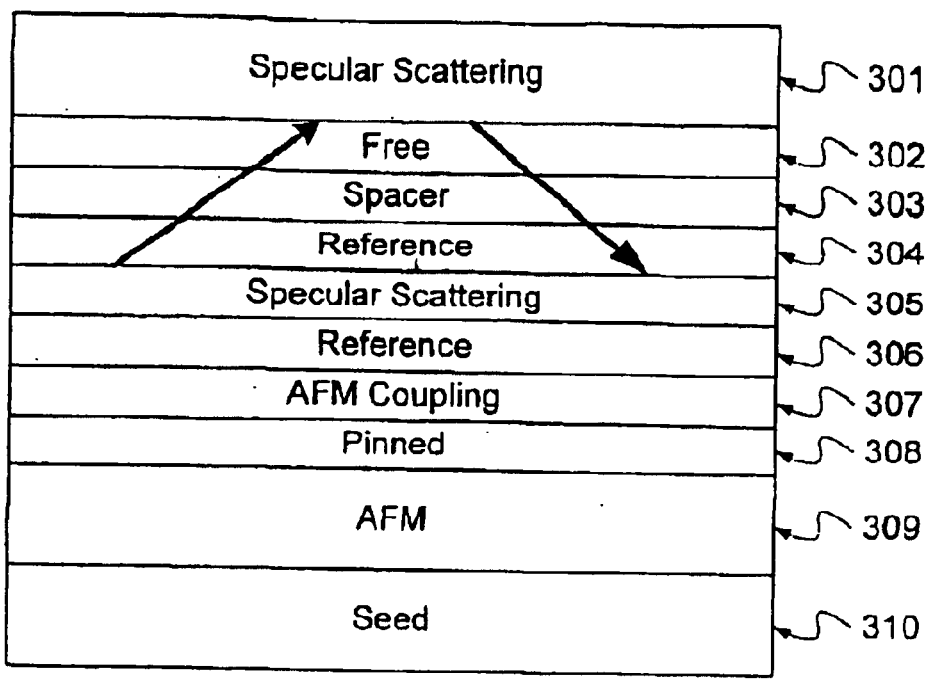
FIGS. 3A–3C illustrate bottom spin valve structures with specular scattering layers and a synthetic antiferromagnetic structure.
Figure 3B:
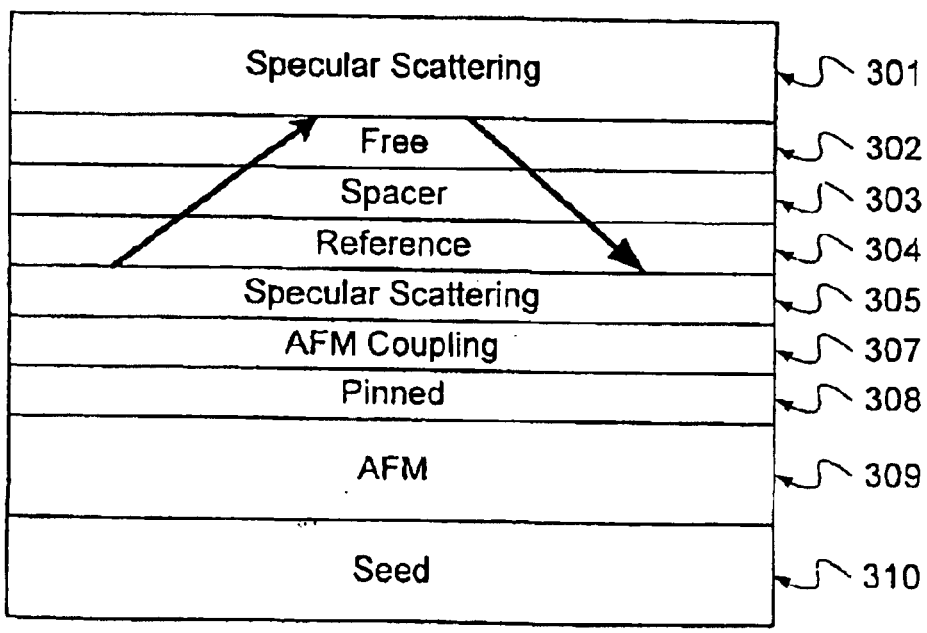

Besides simple spin valve structures, synthetic antiferromagnetic ("SAF") spin valve structures that use specular scattering layers can also be produced. FIGS. 3A and 3B illustrate two SAF bottom spin valve structures. The structures include a seed layer 310, an antiferromagnet layer 309, a pinned layer 308, an antiferromagnetic coupling layer 307, a first reference layer 306, a first specular scattering layer 305, a spacer layer 303, a free layer 302, and a second specular scattering layer 301. As is shown in FIG. 3A, a second reference layer 304 can also be included in the structure.

A typical SAF structure can include an alloy of Co and Fe, or other suitable ferromagnetic materials, as the pinned layer, an alloy of Co and Fe, or other suitable ferromagnetic materials, as the reference layer, and Ru as the antiferromagnetic coupling layer. For example, a structure of CoFe/Ru/CoFe or Co/Ru/Co can be used. The antiferromagnetic coupling layer can also include materials such as Ru, Rh or Cr, or a mixture of these materials. The antiferromagnetic coupling materials can have a high antiferromagnetic exchange coupling constant for Co/X/Co or CoFe/X/CoFe structures.

Figure 3C:
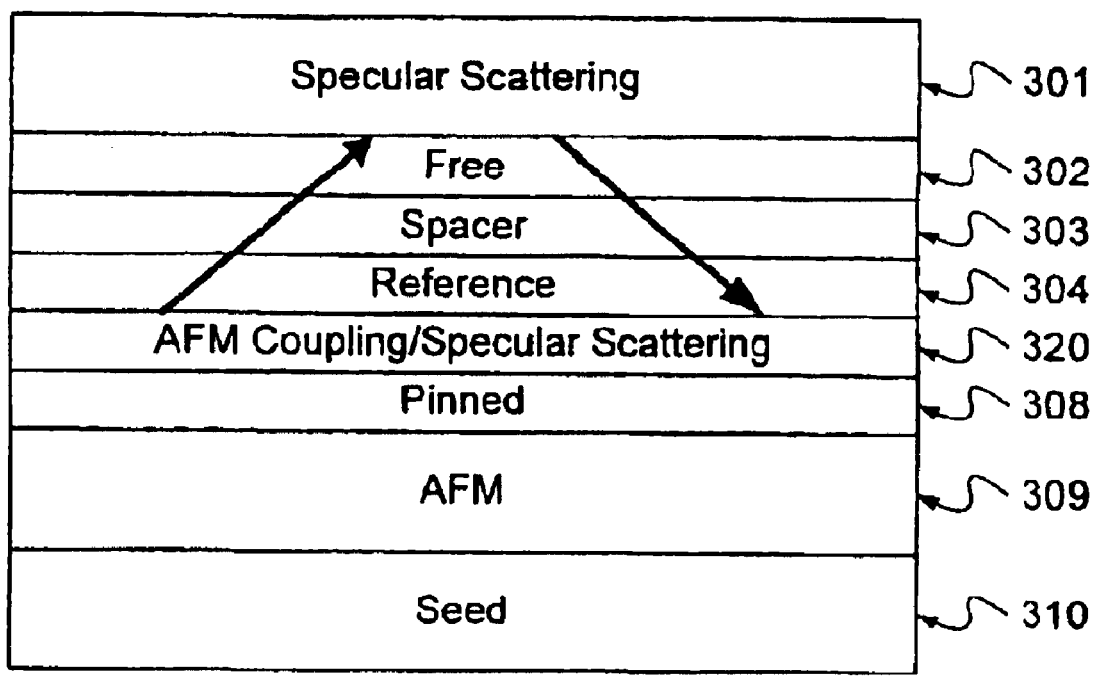

In addition, the antiferromagnetic coupling layer can be co-deposited with the second specular scattering layer as is shown in FIG. 3C. This mixed specular scattering layer 320 can include a mixture of the specular scattering materials, such as $Y_2O_3$, $HfO_2$, MgO, $Al_2O_3$, NiO, $Fe_2O_3$ or $Fe_3O_4$, and the antiferromagnetic coupling materials, such as Ru, Rh, Cr, or a mixture of Ru, Rh, or Cr.

Figure 4:
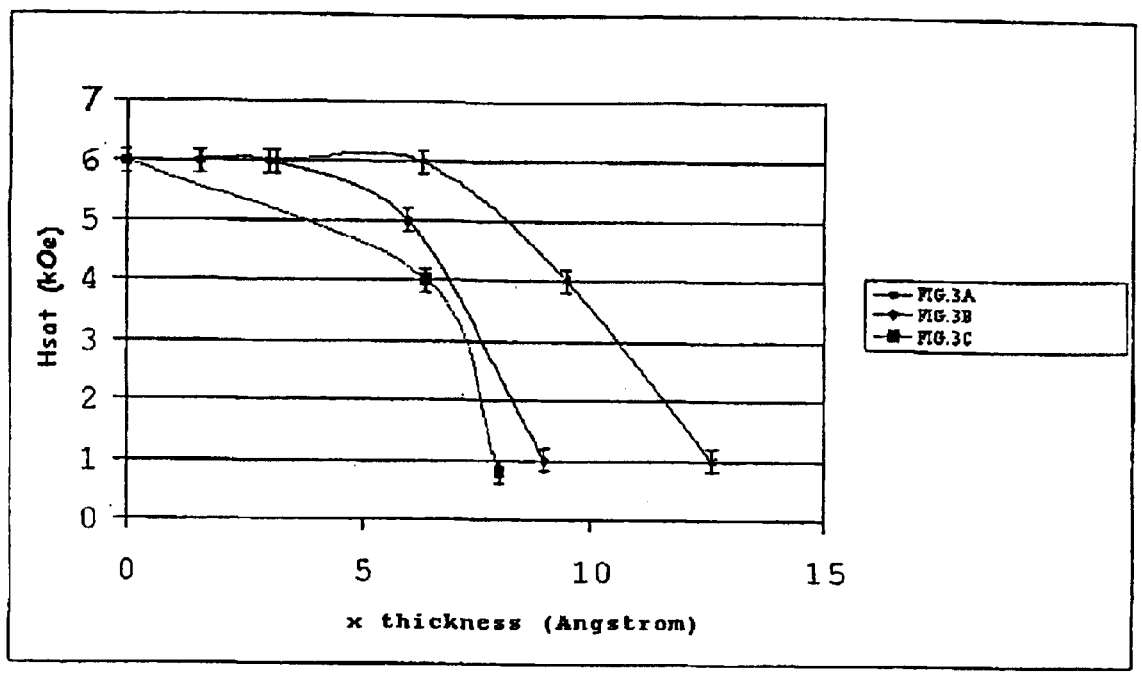
FIG. 4 is a graph of the saturation field verses oxide thickness in synthetic antiferromagnetic structures.

FIG. 4 shows a graph of the saturation field, $H_{sat}$, verses specular layer thickness in a SAF structure. The magnetization of the ferromagnetic layers oppose each other when the SAF structure is an equilibrium state. When an external field is applied to the SAF structure, the magnetic field applies a torque to the layers causing them to depart from their aligned state. If the magnetic field is large enough, the layers will rotate to become magnetically aligned parallel to each other. This is known as the $H_{sat}$. To ensure good spin valve performance in a device, the $H_{sat}$, should be suitably high.

The three lines in FIG. 4 graph the $H_{sat}$, for a SAF structure of the types shown in FIGS. 3A, 3B, and 3C with specular scattering layers, respectively. The SAF structures tested in FIG. 4 include a specular scattering layer of $Y_2O_3$ or $Fe_2O_3$ in the tested spin valve structure. For FIG. 3A, the configuration of the reference/AFM coupling/pinned layer was CoFe/Ru/CoFe/$Fe_2O_3$ (z)/CoFe where z=0 to 13 Angstroms thick. For FIG. 3B, the configuration of the reference/AFM coupling/pinned layer used was CoFe/Ru/$Y_2O_3$ (x)/CoFe where x=0 to 9 Angstroms thick. For FIG. 3C the configuration of the reference/AFM coupling/pinned layer used was CoFe/Ru+$Y_2O_3$ (y)/CoFe where Ru and $Y_2O_3$ are co-deposited and y=0 to 8 Angstroms thick.

Referring to FIG. 4, it becomes apparent that as the specular scattering layer thickness increases the saturation field of the SAF drops. The $H_{sat}$, however, can be suitably high for SAF spin valve applications with a specular scattering layer up to a few Angstroms thick.

The simple spin valve structure and the SAF structure for this invention can be deposited on the seed layer using methods known in the art, including sputtering.

Although the present invention has been described with references to preferred embodiments, workers skilled in the art will recognize that changes may be made in form and detail without departing from the spirit and scope of the invention.

What is claimed is:

1. A spin valve sensor comprising:
   a synthetic antiferromagnetic layer, wherein the synthetic antiferromagnetic layer is composed of a reference layer, a coupling layer, and a pinned layer, further wherein the coupling layer is a mixture of an antiferromagnetic coupling material and a specular scattering material.

2. The spin valve sensor of claim 1, wherein a spacer layer is positioned next to the reference layer.

3. The spin valve sensor of claim, 2, wherein a free layer is positioned next to the spacer layer.

4. The spin valve sensor of claim 3, wherein a specular scattering layer is positioned next to the free layer.

5. The spin valve sensor of claim 4, wherein an antiferromagnetic layer is positioned next to the pinned layer.

6. The spin valve sensor of claim 5, wherein a seed layer is positioned next to the antiferromagnetic layer.

7. The spin valve sensor of claim 1, wherein the antiferromagnetic coupling material is selected from the group consisting Ru, Rh, Cr, or a mixture thereof.

8. The spin valve sensor of claim 1, wherein the specular scattering material is selected from a group consisting $Y_2O_3$, $HfO_2$, MgO, $Al_2O_3$, NiO, $Fe_2O_3$, or $Fe_3O_4$.

9. The spin valve sensor of claim 1, wherein the pinned layer and the reference layer are selected from group consisting of Co and Fe.

10. A magnetoresistive sensor comprising:
    a specular scattering layer;
    a free layer;
    a spacer layer; and
    a synthetic antiferromagnetic layer including a reference layer, a pinned layer and a coupling layer positioned between the reference layer and pinned layer,
    wherein the coupling layer is a single layer composed of a mixture of an antiferromagnetic material and a specular scattering material.

11. The magnetoresistive sensor of claim 10, wherein wherein the antiferromagnetic material is selected from the group consisting Ru, Rh, Cr, or a mixture thereof.

12. The magnetoresistive sensor of claim 10, wherein the specular scattering material is selected from a group consisting $Y_2O_3$, $HfO_2$, MgO, $Al_2O_3$, NiO, $Fe_2O_3$, or $Fe_3O_4$.

13. The magnetoresistive sensor of claim 10, wherein an antiferromagnetic layer is positioned on the synthetic antiferromagnetic layer.

14. The magnetoresistive sensor of claim 12, antiferromagnetic layer is selected from a group comprising PtMn, NiMn, IrMn, and PtCrMn.

15. A spin valve sensor comprising:
 a specular scattering layer;
 a free layer positioned on the specular scattering layer;
 a spacer layer positioned on the free layer; and
 a synthetic antiferromagnetic layer positioned on the spacer layer, the synthetic antiferromagnetic layer including a reference layer, a pinned layer and a coupling layer positioned between the reference layer and pinned layer, wherein the coupling layer is composed of a mixture of an antiferromagnetic material and a specular scattering material.

16. The spin valve sensor of claim 15, wherein wherein the antiferromagnetic material is selected from the group consisting Ru, Rh, Cr, or a mixture thereof.

17. The spin valve sensor of claim 15, wherein the specular scattering material is selected from a group consisting $Y_2O_3$, $HfO_2$, $MgO$, $Al_2O_3$, $NiO$, $Fe_2O_3$, or $Fe_3O_4$.

18. The spin valve sensor of claim 15, wherein an antiferromagnetic layer is positioned on the synthetic antiferromagnetic layer.

19. The spin valve sensor of claim 18, wherein a seed layer is positioned on the antiferromagnetic layer.

* * * * *